United States Patent
Akiike et al.

(10) Patent No.: US 12,241,147 B2
(45) Date of Patent: Mar. 4, 2025

(54) SILICIDE-BASED ALLOY MATERIAL AND DEVICE IN WHICH THE SILICIDE-BASED ALLOY MATERIAL IS USED

(71) Applicant: TOSOH CORPORATION, Yamaguchi (JP)

(72) Inventors: Ryo Akiike, Kanagawa (JP); Yoichiro Koda, Kanagawa (JP); Masami Mesuda, Kanagawa (JP)

(73) Assignee: TOSOH CORPORATION, Yamaguchi (JP)

( * ) Notice: Subject to any disclaimer, the term of this patent is extended or adjusted under 35 U.S.C. 154(b) by 338 days.

(21) Appl. No.: 17/999,050

(22) PCT Filed: May 17, 2021

(86) PCT No.: PCT/JP2021/018519
§ 371 (c)(1),
(2) Date: Nov. 17, 2022

(87) PCT Pub. No.: WO2021/235371
PCT Pub. Date: Nov. 25, 2021

(65) Prior Publication Data
US 2023/0183844 A1    Jun. 15, 2023

(30) Foreign Application Priority Data

May 19, 2020 (JP) .................................. 2020-087267
Dec. 22, 2020 (JP) .................................. 2020-212092

(51) Int. Cl.
| | |
|---|---|
| *C22C 30/00* | (2006.01) |
| *C01B 33/06* | (2006.01) |
| *C22C 24/00* | (2006.01) |
| *H10N 10/851* | (2023.01) |

(52) U.S. Cl.
CPC ............. *C22C 30/00* (2013.01); *C01B 33/06* (2013.01); *C22C 24/00* (2013.01); *H10N 10/8556* (2023.02); *C01P 2002/60* (2013.01); *C01P 2006/32* (2013.01); *C01P 2006/40* (2013.01); *C22C 2202/02* (2013.01)

(58) Field of Classification Search
CPC ..... C22C 30/00; C22C 24/00; C22C 2202/02; C01B 33/06
See application file for complete search history.

(56) References Cited

U.S. PATENT DOCUMENTS

| | | |
|---|---|---|
| 2003/0110892 A1 | 6/2003 | Nicoloau |
| 2015/0243986 A1 | 8/2015 | Negi et al. |

FOREIGN PATENT DOCUMENTS

| | | |
|---|---|---|
| JP | 2002368291 A | 12/2002 |
| JP | 2006-057124 A | 3/2006 |
| JP | 2008147261 A | 6/2008 |
| JP | 2011187688 A | 9/2011 |
| JP | 202172399 A | 5/2021 |
| WO | 2014050100 A1 | 4/2014 |

OTHER PUBLICATIONS

Solde Zeiringer et al., Phase Equilibria, Crystal Chemistry, and Physical Properties of Ag—Ba—Si Clathrates, Japanese Journal of Applied Physics, May 20, 2011, The Japan Society of Applied Physics, Japan, 5pp.

Zeiringer et al., Liquidus projection of the Ag—Ba—Ge system and melting points of clathrate type-I compounds, Journal of Solid State Chemistry, Jun. 4, 2012, pp. 125-131, vol. 196, 7pp.

F. Merlo et al., RMX compounds formed by alkaline earths, europium and ytterbium IV : ternary phases with M = Ag and X = Si, Ge, Sn, Pb, Journal of Alloys and Compounds 232 (1996), pp. 289-295, 7pp.

Raul Cardoso Gil et al., New Examples for the Unexpected Stability of the 10TT-Electron Hueckel Arene [Si6]10-, Z. anorg. Chem. 1999, 625, pp. 285-293, 9pp.

*Primary Examiner* — Jessee R Roe
(74) *Attorney, Agent, or Firm* — HAUPTMAN HAM, LLP

(57) ABSTRACT

A silicide-based alloy material and a device in which the silicide-based alloy material is used are disclosed. The silicide-based alloy material can reduce environmental impact and provide high thermoelectric FIGURE of merit at room temperature. Provided is a silicide-based alloy material comprising, as major components, silver, barium and silicon, wherein atomic ratios of elements that constitute the alloy material are as follows: 9 at %≤Ag/(Ag+Ba+Si)≤27 at %, 20 at %≤Ba/(Ag+Ba+Si)≤53 at %, and 37 at %≤Si/(Ag+Ba+Si)≤65 at %, where Ag represents a content of the silver, Ba represents a content of the barium and Si represents a content of the silicon, and the silicide-based alloy material has an average grain size of less than or equal to 20 μm.

6 Claims, No Drawings

SILICIDE-BASED ALLOY MATERIAL AND DEVICE IN WHICH THE SILICIDE-BASED ALLOY MATERIAL IS USED

RELATED APPLICATIONS

The present application is a National Phase of International Application Number PCT/JP2021/018519 filed on May 17, 2021, which claims the benefit of priority from Japanese Patent Application No. 2020-087267 filed on May 19, 2020, and Japanese Patent Application No. 2020-212092 filed on Dec. 22, 2020.

TECHNICAL FIELD

The present invention relates to a silicide-based alloy material and a device in which the silicide-based alloy material is used.

BACKGROUND ART

Thermoelectric power generation that utilizes waste heat has been known for a long time as a possible way for producing renewable energy. Currently, $Bi_2Te_3$ is used in practical applications for waste heat having a temperature of less than or equal to 200° C. However, Bi—Te-based materials present problems in that both Bi and Te are expensive, and Te is extremely toxic. Accordingly, there is a need for a thermoelectric conversion device that can reduce the cost of power generation and reduce environmental impact.

Furthermore, in recent years, studies have begun to be conducted on applications in, for example, wearable devices, which come into direct contact with the human skin, and, accordingly, there is a need for materials that can avoid harm to the human body.

Silicide materials are excellent materials because they have low environmental impact and low toxicity and are inexpensive, and, therefore, silicide materials are attracting much attention. $Mg_2Si$ and the like are particularly known (see Patent Literature 1, for example). Furthermore, mixtures of $Mg_2Si$ and CaMgSi have been proposed as p-type thermoelectric materials in which elements belonging to the same group in the periodic table are used (see Patent Literature 2, for example). However, such materials have a low Seebeck coefficient of less than or equal to 70 µV/K at 400° C. and, therefore, do not have thermoelectric properties required for practical applications.

Accordingly, there is a need for a thermoelectric conversion material that has low environmental impact and low toxicity and is inexpensive and, in addition, can provide high thermoelectric conversion efficiency over a temperature range of room temperature to approximately 100° C.

Silicides formed of silver, barium and silicon are known to form clathrate compounds, which are known for superconductivity and the rattling phenomenon, when the silicides have a specific compositional ratio. These compounds also exhibit properties of a thermoelectric conversion material, but their performance is low, with their ZT being approximately 0.02 at room temperature, where ZT represents thermoelectric FIGURE of merit, which will be described later (see Non-Patent Literature 1, for example).

In addition, knowledge of the silicides formed of silver, barium and silicon has not been acquired regarding all the compositional ranges, that is, only physical properties for the above-described specific compositional range have been studied.

Note that T denotes an absolute temperature, and Z, which is the FIGURE of merit, is defined by the following equation.

$$Z = \frac{S^2 \sigma}{\kappa} \qquad \text{[Math. 1]}$$

S is the Seebeck coefficient (V/K), and σ is an electrical conductivity and expressed as the reciprocal of an electrical resistance (Ω·m). Furthermore, κ is a thermal conductivity (W/K·m). Furthermore, the numerator portion (the product of the square of S and σ) of Z is referred to as a power factor (W/K²·m).

Furthermore, "(power factor/thermal conductivity)×temperature (K: Kelvin)" is referred to as thermoelectric FIGURE of merit.

The present inventors discovered that when a silicide-based alloy material is one that includes, as major components, silver (Ag), barium (Ba) and silicon (Si) and has multiple crystalline phases and in which a grain size is controlled by a specific compositional ratio, the silicide-based alloy material has limited thermal conductivity and, accordingly, has enhanced thermoelectric FIGURE of merit.

CITATION LIST

Patent Literature

PTL 1: Japanese Unexamined Patent Application Publication No. 2002-368291
PTL 2: Japanese Unexamined Patent Application Publication No. 2008-147261

Non Patent Literature

NPL 1: I. Zeiringer et al. Japanese Journal of Applied Physics 50 (2011)≤05FA01-1

SUMMARY OF INVENTION

Technical Problem

An object of the present invention is to develop a silicide-based alloy material and a device in which the silicide-based alloy material is used. The silicide-based alloy material can reduce environmental impact and provide high thermoelectric FIGURE of merit at room temperature.

Solution to Problem

Specifically, a summary of the present invention is as follows.

(1)

A silicide-based alloy material comprising, as major components, silver, barium and silicon, characterized in that atomic ratios of elements that constitute the alloy material are as follows:

9 at %≤Ag/(Ag+Ba+Si)≤27 at %, 20 at %≤Ba/(Ag+Ba+Si)≤53 at %, and 37 at %≤Si/(Ag+Ba+Si)≤65 at %, where Ag represents a content of the silver, Ba represents a content of the barium and Si represents a content of the silicon, and the silicide-based alloy material has an average grain size of less than or equal to 20 μm.

(2)

The silicide-based alloy material according to (1), wherein the silicide-based alloy material has a relative density of greater than or equal to 95%.

(3)

A thermoelectric conversion device in which the silicide-based alloy material according to (1) or (2) is used.

(4)

A thermoelectric conversion module in which the thermoelectric conversion device according to (3) is used.

Advantageous Effects of Invention

With the silicide-based alloy material of the present invention, a thermoelectric conversion device having high efficiency for a wide temperature range can be produced.

DESCRIPTION OF EMBODIMENTS

The present invention will be described in detail below.

A silicide-based alloy material of the present invention is a silicide-based alloy material comprising, as major components, silver (Ag), barium (Ba) and silicon (Si). Atomic ratios of the elements that constitute the alloy material are as follows:

9 at %≤Ag/(Ag+Ba+Si)≤27 at %, 20 at %≤Ba/(Ag+Ba+Si)≤53 at %, and 37 at %≤Si/(Ag+Ba+Si)≤65 at %, where Ag represents a content of the silver (Ag), Ba represents a content of the barium (Ba) and Si represents a content of the silicon (Si).

Preferably, the atomic ratios are as follows:

9 at %≤Ag/(Ag+Ba+Si)≤27 at %, 20 at %≤Ba/(Ag+Ba+Si)≤45 at %, and 37 at %≤Si/(Ag+Ba+Si)≤65 at %.

Particularly preferably, the atomic ratios are as follows:

15 at %≤Ag/(Ag+Ba+Si)≤27 at %, 30 at %≤Ba/(Ag+Ba+Si)≤39 at %, and 40 at %≤Si/(Ag+Ba+Si)≤55 at %.

When the above-mentioned ranges are satisfied, the silicide-based alloy material of silver (Ag), barium (Ba) and silicon (Si) has a semiconductor crystalline phase that exhibits excellent thermoelectric FIGURE of merit in a low-temperature range. If the compositional range is not satisfied, the silicide-based alloy material has physical properties of a metallic crystalline phase or a crystalline phase with a low conductivity and, consequently, has significantly degraded thermoelectric FIGURE of merit.

Furthermore, the silicide-based alloy material of the present invention has an average grain size of less than or equal to 20 μm. The average grain size is preferably 1 nm to 20 μm, preferably 100 nm to 20 μm, preferably 100 nm to 5 μm, more preferably 100 nm to 1 μm and most preferably 100 nm or greater and 700 nm or less. Regarding the average grain size, high thermal conductivity is the major reason that the performance of thermoelectric conversion devices remains at a low level, and limiting the average grain size to be a small size enables a reduction in the thermal conductivity.

However, different types of materials have different suitable average grain sizes for efficiently inhibiting thermal conduction. This is because phonons, which conduct heat, have different mean free paths for different types of materials. In addition, if the average grain size is less than 1 nm, electrical conductivity is likely to be low, and, consequently, a problem arises in that the performance of thermoelectric conversion devices is degraded.

As referred to herein, the average grain size is a value determined by counting the number of grains having a specific size in a specific region with respect to the number of gains observed therein, and calculating an average.

For low-temperature thermoelectric material applications, it is preferable that the silicide-based alloy material have a textural structure including a crystalline phase belonging to space group 229 and a crystalline phase belonging to space group 70. Furthermore, for achieving high thermoelectric FIGURE of merit for a low-temperature range near 100° C., it is preferable that an abundance ratio of (phase 1/(phase 1+phase 2)) in the crystal structure, where phase 1 is a phase belonging to space group 229, and phase 2 is a phase belonging to space group 70, be as follows:

0.00001≤(phase 1/(phase 1+phase 2))≤0.1.

More preferably, the abundance ratio is as follows:

0.00001≤(phase 1/(phase 1+phase 2))≤0.08.

Most preferably, the abundance ratio is as follows:

0.0001≤(phase 1/(phase 1+phase 2))≤0.05.

The silicide-based alloy material of the present invention may include small amounts of incidental impurities. Examples of the impurities include metal elements other than Si, Ag or Ba and compounds, such as oxides, of any of the metal elements.

Furthermore, it is preferable that the silicide-based alloy material of the present invention have a high relative density so as to have both a high Seebeck coefficient and a low electrical resistivity. However, from the standpoint of limiting the thermal conductivity, it is also preferable that microscopic pores be present within the silicide-based alloy material. Accordingly, the relative density is preferably greater than or equal to 90%. The relative density is more preferably 90 to 99.5%, even more preferably 95 to 99.5% and most preferably 97 to 99.5%.

The silicide-based alloy material of the present invention has a high Seebeck coefficient and a low electrical resistivity. The high Seebeck coefficient is one feature. An absolute value of the Seebeck coefficient is preferably 100 to 1000 μV/K and particularly preferably 200 to 500 μV/K.

Another feature of the silicide-based alloy material of the present invention is the low electrical resistivity. The electrical resistivity is preferably 1.00e-3 to 1.00e-1 Ω·cm and particularly preferably 1.00e-3 to 1.00e-2 Ω·cm.

The silicide-based alloy material of the present invention is a material having limited thermal conductivity. The thermal conductivity is preferably 0.1 to 20 W/mK and particularly preferably 0.5 to 5 W/mK.

Another feature of the silicide-based alloy material of the present invention is high thermoelectric FIGURE of merit. The thermoelectric FIGURE of merit in terms of the FIGURE of merit is preferably 0.01 to 5 and particularly preferably 0.1 to 5.

Now, a method for producing the silicide-based alloy material of the present invention will be described.

A preferred method for producing the silicide-based alloy material of the present invention is a production method including a step of synthesizing an alloy from silver, barium and silicon; a step of pulverizing or quenching, whichever is appropriate, the alloy into a powder: and a sintering step including hot-pressing the alloy powder at a sintering temperature of 650° C. to 950° C.

First, the step of synthesizing an alloy from silver, barium and silicon is performed as follows. Silver, barium and silicon in predetermined ratios are prepared and pre-melted in an arc melting furnace to synthesize silver-barium silicide. This is to remove impurities from the powder and refine the microstructure of the alloy, which will be described later. In addition, regarding melting conditions, rather than performing the melting with low discharge power for a long time, performing the treatment with high power for a short time is preferable. Preferably, a magnitude of the current is greater than or equal to 30 A/g, which is a current value per unit amount of a sample. Preferably, the magnitude of the current is less than or equal to 100 A/g. This is because if the discharge power is excessively high, a portion of the metals evaporates, which changes the compositional ratio.

The alloy produced under the preferred conditions is an alloy of silver-barium silicide.

The subsequent step of pulverizing the alloy into a powder or quenching the alloy, whichever is appropriate, is a step of reducing a particle size of the resulting powder.

In the instance where pulverization is performed, it is preferable that the operation of the pulverization be performed in an inert gas atmosphere to prevent an oxygen content of the alloy from increasing after synthesis. The use of an inert gas atmosphere prevents oxidation of a surface of the powder, thereby enabling the oxygen content to be kept at a low level. Furthermore, the textural structure of the silicide-based alloy material that is formed can be controlled in accordance with the method used for the pulverization. Examples of methods for pulverization and granulation that may be used include pulverization in a mortar, ball milling, jet milling, bead milling, spray drying and gas atomization. It is preferable that the resulting powder have as small a primary particle size as possible. Furthermore, in the instance where the powder is granulated, an average particle size of the granulated powder is not particularly limited and may be approximately 10 to 100 μm, which is more preferable from the standpoint of handleability and the like.

Furthermore, a silicide-based alloy material suitable as a high-temperature thermoelectric material and a silicide-based alloy material suitable as a low-temperature thermoelectric material can each be produced. This is made possible by varying the compositional ratio between the raw materials. The silicide-based alloy material suitable as a high-temperature thermoelectric material and the silicide-based alloy material suitable as a low-temperature thermoelectric material can each be produced by mixing the raw material powders in a manner such that a compositional ratio in accordance with the above-mentioned Ag, Ba and Si ratios is achieved.

In the instance where quenching is performed, a molten form of the silicide-based alloy material may be sprayed onto a water-cooled copper roller rotating at 3000 rpm. In this case, the silicide-based alloy material in the molten form can be instantaneously solidified to form a thin strip (quenched thin strip). In an example, the quenching may be performed at a cooling rate of approximately $8 \times 10^5$ K/s.

The final sintering step, in which the alloy powder is hot-pressed at a sintering temperature of 650° C. to 950° C., may use any of various sintering methods, which include hot pressing, which is a type of pressure sintering, performed in an atmosphere-controlled furnace, and include spark plasma sintering.

An example of a spark plasma sintering method (hereinafter abbreviated as an "SPS method"), which is a type of pressure sintering, will be described below. The spark plasma sintering method is an apparatus for performing sintering by applying a high current directly to the powder while applying a pressure to the powder. The sintering method performs uniaxial pressing during heating, thereby enabling the powder to be heated to a high temperature in a short time and accordingly, enabling the production of a dense silicide-based alloy material, with its fine particle size being maintained. In the instance where an SPS method is used for the sintering, the density is improved over that of the related art, and the resulting silicide-based alloy material can have a relative density of greater than or equal to 80%, provided that a theoretical density of $AgBa_2Si_3$ is 4.78 g/cm$^3$.

The SPS method uses a sintering temperature of 650° C. to 950° C. and preferably a temperature of 700° C. to 900° C. for sintering. If the temperature is less than 650° C., the sintering does not proceed, and, consequently, the relative density only has an improvement of approximately 60%. If the sintering is performed at a temperature greater than 950° C., the alloy may melt and adhere to a hot pressing die, which may reduce the yield.

In the instance of silicide-based alloy materials suitable as thermoelectric conversion materials, it is preferable that the sintering temperature be greater than or equal to 750° C. because in this case, high thermoelectric FIGURE of merit can be easily achieved.

It is preferable that a pressure during the sintering be 10 MPa to 100 MPa.

In the SPS method, a holding time at the sintering temperature is not particularly limited and is preferably less than or equal to 10 minutes. If the holding time is extremely short, uniform heating cannot be achieved for an inner portion, and, therefore, retaining the shape of the polycrystalline body is difficult. On the other hand, if the holding time is, for example, more than or equal to 10 minutes, an increase in the particle size is induced, which may result in an increase in the thermal conductivity.

The silicide-based alloy material of the present invention may be processed to have predetermined dimensions. Examples of methods for the processing that may be used include, but are not limited to, surface grinding methods, rotary grinding methods and cylindrical grinding methods. With any of these methods, the silicide-based alloy material can be processed to have a shape suitable for thermoelectric conversion device applications.

It is preferable that the silicide-based alloy material of the present invention be used in a thermoelectric conversion device.

Thermoelectric conversion devices are produced with p-type and n-type semiconductors. Accordingly, it is preferable that the semiconductor materials to be used be materials that can perform p-type control and n-type control. In the present invention, the p-type control and the n-type control can be achieved by doping an alloy of silver, barium and ruthenium with specific elements.

An example of a method for producing a thermoelectric conversion device in which the silicide-based alloy material is used will be described below.

A p-type silicide-based alloy material and an n-type silicide-based alloy material are positioned in parallel, out of contact with each other. An electrode is placed on their upper portions to span the space therebetween. In instances where a π-shaped device is formed with this structure, the device is structured such that an upper portion thereof is exposed to high temperatures, and thus, when the device is heated, a temperature gradient occurs between the upper portion and a lower portion in the device. Accordingly, the potential difference due to the Seebeck effect corresponding to the temperature difference, denoted as ΔT (=TH−TL), produces a current. Accordingly, a circuit can be formed in which an electrode is attached to the p-type silicide-based alloy material and the n-type silicide-based alloy material at the lower portion of the device with a suitable resistor disposed therebetween. In this instance, an effect of a battery can be produced.

A plurality of the above-described thermoelectric conversion devices can be integrated to form a thermoelectric conversion module from which high power can be drawn. Examples of the thermoelectric conversion module include single-stage thermoelectric conversion modules, cascade-type modules and segment-type modules. Among these, single-stage thermoelectric conversion modules are preferable. A single-stage thermoelectric conversion module, which is preferable among thermoelectric conversion modules, will be described below.

The single-stage thermoelectric conversion module has a structure in which a plurality of the above-described thermoelectric conversion devices is integrated. For example, in a circuit disposed adjacent to the low-temperature-side of the thermoelectric conversion devices, a plurality of the thermoelectric conversion devices may be integrated in series, which can improve an output voltage; or a plurality of the thermoelectric conversion devices may be integrated in parallel, which can increase an output current. By providing a necessary integrated structure in accordance with the intended application, it is possible to control the output voltage and the output current.

EXAMPLES

Examples of the present invention will be described below. It should be noted that the present invention is not limited to the examples.

(Method for Measuring Average Grain Size)

Measurements were performed with a field emission scanning electron microscope JSM-7100F (manufactured by Jeol Ltd.) equipped with an EBSD. The grain boundaries were determined as boundaries defining a misorientation of 5° or greater at crystal interfaces.

(Method for Measuring Crystalline Phases)

X-ray diffraction measurements were performed, and crystalline phases were identified from the obtained diffraction peaks.

(Method for Measuring Composition)

Quantitative determinations were made by ICP-MS mass spectrometry.

(Method for Measuring Electrical Properties)

Measurements were performed with a Hall effect measurement system (ResiTest 8400, manufactured by TOYO Corporation).

(Method for Measuring Seebeck Coefficient)

A Seebeck coefficient measurement system (an option to the ResiTest 8400, manufactured by TOYO Corporation) was attached to the Hall effect measurement system, and measurements were performed.

(Method for Measuring Thermal Conductivity)

Measurements were performed with a laser-flash thermal conductivity measurement device (TC-1200RH, manufactured by Advance Riko, Inc.).

Example 1

Silicon pieces (purity: 4N, average size: 1 cm, manufactured by Kojundo Chemical Laboratory Co., Ltd.), silver granules (purity: 99.9%, average particle size: 1 mm, manufactured by Kojundo Chemical Laboratory Co., Ltd.) and barium (purity: 99%, average particle size: 2 cm×1 mm, manufactured by Kojundo Chemical Laboratory Co., Ltd.) were mixed together in the following ratios: Ag/(Ag+Ba+Si)=17 at %, Ba/(Ag+Ba+Si)=34 at % and Si/(Ag+Ba+Si)=49 at %. Subsequently, the mixture was loaded into a water-cooled mold and subjected to arc melting. The resulting ingot of the raw materials was ground in a mortar within an agate mortar to form a powder. The obtained powder was loaded into a circular carbon die (φ=10 mm) and subjected to spark plasma sintering. The sintering conditions included a heating rate of 100° C./min over a temperature range of 600° C. and greater, a holding time of 10 minutes at a sintering temperature of 900° C. and a pressure of 75 MPa. Furthermore, a degree of vacuum was 5.0e-3 Pa. The temperatures were measured with a radiation thermometer (IR-AHS, manufactured by Chino Corporation).

From the results of the EBSD measurements, a crystalline phase of $AgBa_2Si_3$ (space group 70), with which a Ba phase in an area ratio of approximately 0.001% coexisted, was observed in the obtained alloy material.

The relative density of the obtained alloy material was 95.2% as calculated by the Archimedes method using a theoretical density of $AgBa_2Si_3$ of 4.78 g/cm$^3$, assuming that the alloy material was pure $AgBa_2Si_3$.

Subsequently, the alloy material was processed into pieces having a size of 10 mm ((φ)×1 mm (t) to be used as electrical properties measurement samples and thermal conductivity measurement samples. The samples were each subjected to the measurements. The measurement conditions were as follows. The Seebeck coefficient and the electrical resistance were measured at 50° C. in a vacuum. The thermal conductivity was measured at 50° C. in a He atmosphere. The measurement results are shown in Table 1.

Examples 2 to 9

Silicide-based alloy materials were prepared in a manner similar to that of Example 1, except that the compositions shown in Table 1 were used.

Examples 10 to 16

Silicide-based alloy materials were prepared in a manner similar to that of Example 1, except that the compositions shown in Table 2 were used.

Comparative Examples 1 to 4

Silicide-based alloy materials were prepared in a manner similar to that of Example 1, except that the compositions shown in Table 3 were used.

TABLE 1

| | Composition | | | | Average grain size (nm) | Crystalline phase | | Abundance ratio between space groups 229 and 70 Space group 229/ space group 70 | Relative density (%) | Seebeck coefficient (μV/K) | Electrical resistivity (Ω·cm) | Thermal conductivity (W/mK) | Thermoelectric figure of merit-ZT |
|---|---|---|---|---|---|---|---|---|---|---|---|---|---|
| | Ag at % | Ba at % | Si at % | Ag + Ba + Si | | | | | | | | | |
| Example 1 | 17 | 34 | 49 | 100 | 400 | 70 | 229 | 0.01 | 95.2 | −213 | 2.90E−03 | 2.3 | 0.22 |
| Example 2 | 18 | 33 | 49 | 100 | 500 | 70 | 229 | 0.008 | 95.4 | −156 | 2.20E−03 | 2.6 | 0.14 |
| Example 3 | 16 | 36 | 48 | 100 | 450 | 70 | 229 | 0.012 | 96 | −154 | 1.60E−03 | 2.7 | 0.18 |
| Example 4 | 20 | 30 | 50 | 100 | 470 | 70 | 229 | 0.005 | 95.8 | −206 | 2.70E−03 | 2.2 | 0.23 |
| Example 5 | 15 | 30 | 55 | 100 | 510 | 70 | 229 | 0.005 | 94.6 | −184 | 2.30E−03 | 2.9 | 0.16 |
| Example 6 | 20 | 35 | 45 | 100 | 490 | 70 | 229 | 0.012 | 96.5 | −140 | 2.40E−03 | 2.2 | 0.12 |
| Example 7 | 9 | 35 | 56 | 100 | 600 | 70 | 229 227 | 0.06 | 94.3 | −230 | 7.20E−03 | 2.1 | 0.11 |
| Example 8 | 27 | 20 | 53 | 100 | 550 | 70 | 229 227 | 0.07 | 97.2 | −120 | 1.40E−03 | 3.3 | 0.1 |
| Example 9 | 10 | 53 | 37 | 100 | 440 | 70 | 229 | 0.1 | 94.6 | −280 | 5.20E−03 | 4.5 | 0.11 |

TABLE 2

| | Composition | | | | Average grain size (nm) | Crystalline phase | | Abundance ratio between space groups 229 and 70 Space group 229/ space group 70 | Relative density (%) | Seebeck coefficient (μV/K) | Electrical resistivity (Ω·cm) | Thermal conductivity (W/mK) | Thermoelectric figure of merit-ZT |
|---|---|---|---|---|---|---|---|---|---|---|---|---|---|
| | Ag at % | Ba at % | Si at % | Ag + Ba + Si | | | | | | | | | |
| Example 10 | 18 | 36 | 46 | 100 | 590 | 70 | 229 | 0.005 | 95 | 398 | 6.07E−03 | 1.6 | 0.52 |
| Example 11 | 18 | 36 | 46 | 100 | 530 | 70 | 229 | 0.005 | 94.4 | 435 | 6.73E−03 | 2.1 | 0.42 |
| Example 12 | 18 | 35 | 47 | 100 | 510 | 70 | 229 | 0.01 | 96.3 | −150 | 1.50E−03 | 2.3 | 0.21 |
| Example 13 | 18 | 36 | 46 | 100 | 500 | 70 | 229 | 0.001 | 94.3 | 333 | 7.88E−03 | 2.4 | 0.19 |
| Example 14 | 17 | 38 | 45 | 100 | 450 | 70 | 229 | 0.0006 | 94.6 | 355 | 5.20E−03 | 2.1 | 0.38 |
| Example 15 | 16 | 40 | 44 | 100 | 470 | 70 | 229 | 0.0003 | 95.8 | 418 | 1.75E−02 | 2.7 | 0.12 |
| Example 16 | 18 | 39 | 43 | 100 | 490 | 70 | 229 | 0.0002 | 95.3 | 438 | 1.04E−02 | 2.7 | 0.22 |

TABLE 3

| | Composition | | | | Average grain size (nm) | Crystalline phase | | | Abundance ratio between space groups 229 and 70 Space group 229/ space group 70 | Seebeck coefficient (μV/K) | Electrical resistivity (Ω·cm) | Thermal conductivity (W/mK) | Thermoelectric figure of merit-ZT |
|---|---|---|---|---|---|---|---|---|---|---|---|---|---|
| | Ag at % | Ba at % | Si at % | Ag + Ba + Si | | | | | | | | | |
| Comparative Example 1 | 2 | 48 | 50 | 100 | 1200 | 63 | 227 | | — | −40 | 7.30E−04 | 34 | 0.002 |
| Comparative Example 2 | 35 | 35 | 30 | 100 | 14000 | 225 | 63 | | — | −34 | 4.30E−04 | 231 | 0.0004 |
| Comparative Example 3 | 15 | 15 | 70 | 100 | 21000 | 227 | 62 | | — | 320 | 6.20E−02 | 35 | 0.002 |
| Comparative Example 4 | 45 | 5 | 50 | 100 | 23000 | 225 | 227 | 229 | — | −26 | 2.30E−04 | 211 | 0.0004 |

In the instances where the alloy materials of Examples 1 to 16, which had a compositional range of the present invention, were used, high thermoelectric FIGURE of merit was achieved. In contrast, in the instances of the alloy materials of Comparative Examples 1 to 4, which had a compositional range outside that of the present invention, all of the samples had low thermoelectric FIGURE of merit.

INDUSTRIAL APPLICABILITY

With the use of the present invention, thermoelectric conversion devices having high performance can be produced, which enables efficient utilization of waste heat over a wide temperature range.

Although the present invention has been described in detail with reference to particular embodiments, it will be apparent to those skilled in the art that various changes and modifications can be made without departing from the spirit and scope of the present invention.

The present application is based on a Japanese patent application filed on May 19, 2020 (Japanese Patent Application No. 2020-087267) and a Japanese patent application filed on Dec. 22, 2020 (Japanese Patent Application No. 2020-212092), the entire disclosures of which are incorporated herein by reference. Furthermore, all references cited herein are incorporated in their entireties.

The invention claimed is:

1. A silicide-based alloy material comprising, as major components, silver, barium and silicon, wherein
   atomic ratios of elements that constitute the alloy material are as follows:
   9 at % ≤ Ag/(Ag+Ba+Si) ≤ 27 at %,
   20 at % ≤ Ba/(Ag+Ba+Si) ≤ 53 at %, and
   37 at % ≤ Si/(Ag+Ba+Si) ≤ 65 at %,
   where Ag represents a content of the silver, Ba represents a content of the barium and Si represents a content of the silicon, and
   the silicide-based alloy material has an average grain size of less than or equal to 20 μm.

2. The silicide-based alloy material according to claim 1, wherein the silicide-based alloy material has a relative density of greater than or equal to 80%.

3. A thermoelectric conversion device in which the silicide-based alloy material according to claim 2 is used.

4. A thermoelectric conversion module in which the thermoelectric conversion device according to claim 3 is used.

5. A thermoelectric conversion device in which the silicide-based alloy material according to claim 1 is used.

6. A thermoelectric conversion module in which the thermoelectric conversion device according to claim 5 is used.

* * * * *